United States Patent
Kim (10) Patent No.: US 8,705,279 B2
(45) Date of Patent: Apr. 22, 2014

(54) NONVOLATILE MEMORY DEVICE AND READING METHOD THEREOF

(75) Inventor: Se Hyun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 167 days.

(21) Appl. No.: 13/341,472

(22) Filed: Dec. 30, 2011

(65) Prior Publication Data

US 2013/0107633 A1 May 2, 2013

(30) Foreign Application Priority Data

Oct. 26, 2011 (KR) .................. 10-2011-0109735

(51) Int. Cl.
*G11C 11/34* (2006.01)

(52) U.S. Cl.
USPC ............ 365/185.09; 365/185.03; 365/185.22; 365/189.011; 365/189.15; 365/201; 365/230.06; 365/233.17

(58) Field of Classification Search
USPC ........... 365/185.03, 185.09, 185.22, 189.011, 365/189.15, 201, 230.06, 233.17
See application file for complete search history.

(56) References Cited

U.S. PATENT DOCUMENTS

2012/0257453 A1* 10/2012 Shiino et al. ............. 365/185.18

FOREIGN PATENT DOCUMENTS

| KR | 1020100054566 A | 5/2010 |
| KR | 1020100091418 A | 8/2010 |
| KR | 1020100136729 A | 12/2010 |
| KR | 1020110030172 A | 3/2011 |

* cited by examiner

*Primary Examiner* — Fernando Hidalgo
(74) *Attorney, Agent, or Firm* — William Park & Associates Patent Ltd.

(57) ABSTRACT

In a method of reading a nonvolatile memory device, the method comprising, a reading operation of reading data of a selected memory cell; and a read retry operation of performing one or more read operations by changing a non-selection read voltage applied to non-selected memory cells until the read operation succeeds, when it is detected that an error has occurred in the operation of reading data.

17 Claims, 9 Drawing Sheets

NONVOLATILE MEMORY DEVICE AND READING METHOD THEREOF

CROSS-REFERENCES TO RELATED APPLICATION

The present application claims priority under 35 U.S.C. §119(a) to Korean application number 10-2011-0109735, filed on Oct. 26, 2011, in the Korean Intellectual Property Office, which is incorporated herein by reference in its entirety as set forth in full.

BACKGROUND

1. Technical Field

The present invention relates to a nonvolatile memory device, and more particularly, to a reading method of a nonvolatile memory device.

2. Related Art

Semiconductor memory devices are generally classified into a volatile memory device and a nonvolatile memory device. The volatile memory device looses stored data when power is cut off, but the non-volatile memory device preserves stored data even when power is cut off. The nonvolatile memory device includes various types of memory cell transistors. The nonvolatile memory device can be divided into a flash memory device, a ferroelectric RAM (FRAM), a magnetic RAM (MRAM), a phase change RAM (PRAM), etc. according to the structure of the memory cell transistor.

The flash memory device is generally divided into a NOR flash memory device and a NAND flash memory device according to a connection state between a memory cell and a bit line. The NOR flash memory device has a structure in which two or more memory cell transistors are connected in parallel to one bit line. Thus, the NOR flash memory device has an excellent random access time characteristic. On the other hand, the NAND flash memory device has a structure in which two or more memory cell transistors are connected in series to one bit line. Such a structure is referred to as a cell string structure, and one bit line contact is required per cell string. Thus, the NAND flash memory device has an excellent characteristic in terms of a degree of integration.

The memory cells of the flash memory device are divided into an on-cell and an off-cell according to threshold voltage distributions. The on-cell is an erased cell, and the off-cell is a programmed cell. In order to read the memory cells of a flash memory device, a selection read voltage is applied to a selected memory cell, and a non-selection read voltage is applied to a non-selected memory cell.

The selection read voltage applied to the selected memory cell is a voltage for deciding an erase or program state of a selected memory cell. Therefore, if the selection read voltage is applied to a selected memory cell, cell current of the selected memory cell flows through a bit line based on a threshold voltage of the selected memory cell. The non-selection read voltage applied to a non-selected memory cell is a voltage sufficient to turn on the non-selected memory cell. Therefore, if the non-selection read voltage is applied to the non-selected memory cell, the cell current of the selected memory cell flows through the bit line without a decrease in cell current. The selection read voltage and the non-selection read voltage are generated from a voltage generator of the flash memory device. The selection read voltage and the non-selection read voltage are respectively applied to the selected memory cell and the non-selected memory cell without variations in voltage.

SUMMARY

A memory device and a reading method thereof, which can effectively prevent a read error, are described herein.

In one embodiment of the present invention, a method of reading a nonvolatile memory device includes a reading operation of reading data of a selected memory cell, and a read retry operation of performing one or more read operations by changing a non-selection read voltage applied to non-selected memory cells until the read operation succeeds, when it is detected that an error has occurred in the operation of reading data.

In another embodiment of the present invention, a method of reading a nonvolatile memory device includes a read operation of reading data of a selected memory cell, a first read retry operation of performing one or more read operations by changing a selection read voltage applied to the selected memory cell until the read operation succeeds, when it is detected that an error has occurred in the read operation, and a second read retry operation of performing one or more read operations by changing a non-selection read voltage applied to non-selected memory cells until the read operation succeeds, when it is detected that an error has occurred in the first read retry operation.

In still another embodiment of the present invention, a nonvolatile memory device includes a memory cell array configured to comprise a plurality of memory cells arranged in intersection portions of word lines and bit lines, and a control logic configured to control a read operation of a selected memory cell among the plurality of memory cells and one or more read retry operations by changing a non-selection read voltage applied to non-selected memory cells among the plurality of memory cells when the read operation is not successfully completed.

BRIEF DESCRIPTION OF THE DRAWINGS

Features, aspects, and embodiments are described in conjunction with the attached drawings, in which.

DETAILED DESCRIPTION

Hereinafter, a nonvolatile memory device and a method of reading thereof according to the present invention will be described below with reference to the accompanying drawings through exemplary embodiments.

Figure 1:
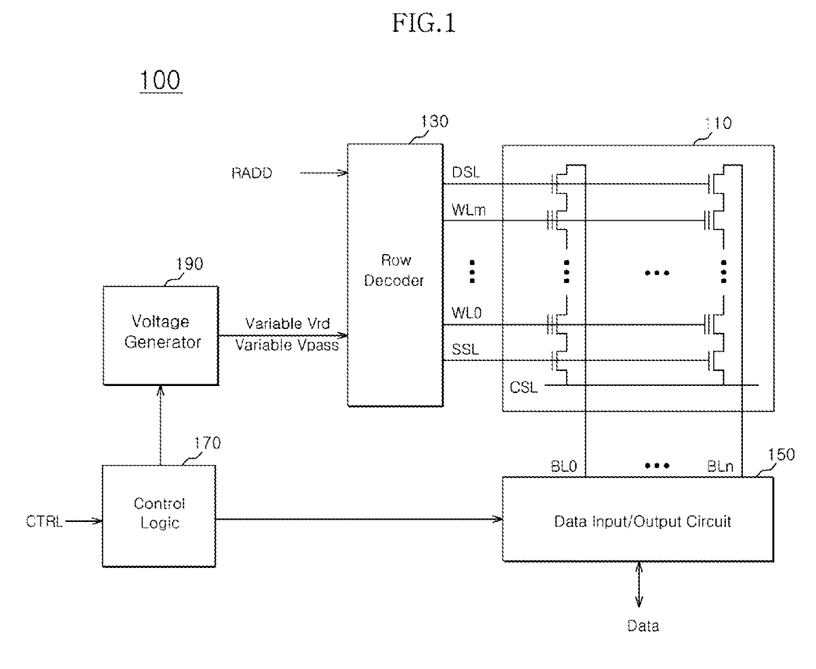
FIG. 1 is a block diagram illustrating a nonvolatile memory device according to one embodiment.

FIG. 1 is a block diagram illustrating a nonvolatile memory device according to one embodiment. Referring to FIG. 1, the nonvolatile memory device 100 includes a memory cell array 110, a row decoder 130, a data input/output circuit 150, a control logic 170 and a voltage generator 190.

The memory cell array 110 includes a plurality of memory cells arranged in intersection portions of bit lines BL0 to BLn and word lines WL0 to WLn. As an example, each of the memory cells can store 1-bit data. The memory cell is referred to as a single level cell (SLC). The SLC is programmed to have a threshold voltage corresponding to any one of an erase state and a program state. As another example, each of the memory cells of a multi level cell (MLC) can store 2 or more-bit data. The MLC is programmed to have a threshold voltage corresponding to any one of an erase state and a plurality of program states.

The row decoder 130 is configured to select the word lines WL0 to WLm in response to a row address RADD. The row decoder 130 is configured to transfer various word line voltages provided from the voltage generator 190 to a selected word line and non-selected word lines. For example, in a read operation, the row decoder 130 transfers a selection read voltage Vrd to the selected word line, and transfers a non-selection read voltage Vpass to the non-selected word lines.

The data input/output circuit 150 operates under control of the control logic 170. The data input/output circuit 150 is configured to operate as a write driver or sense amplifier according to an operation mode. As an example, in a program operation, the data input/output circuit 150 stores data inputted through a data input/output buffer (not shown) in a memory cell of the memory cell array 110. As another example, in the read operation, the data input/output circuit 150 outputs data read from the memory cell of the memory cell array 110 through the data input/output buffer (not shown). The data input/output circuit 150 can include a plurality of data input/output circuits connected to the respective bit lines BL0 to BLn. Thus, the bit lines BL0 to BLn can be selected or controlled by the respective data input/output circuits 150.

The control logic 170 is configured to control all sorts of operations of the nonvolatile memory device 100 in response to a control signal CTRL provided from an external device (e.g., a memory controller, a memory interface, a host, etc.). For example, the control logic 170 controls read, program (or write) and erase operations of the nonvolatile memory device 100. In order to perform these operations, the control logic 170 controls the data input/output circuit 150 and the voltage generator 190. According to this embodiment, the control logic 170 can control the data input/output circuit 150 and the voltage generator 190 so that a read retry operation is performed on a memory cell detected as one in which a read error occurs in the read operation.

The voltage generator 190 operates under control of the control logic 170. The voltage generator 190 is configured to generate voltages required in the read operation (e.g. a selection read voltage and a non-selection read voltage), voltages required in the program operation (e.g., a program voltage) and voltages required in the erase operation (e.g., a voltage to be applied to a bulk region in which the memory cells are formed) according to the operation mode. The voltage generator 190 may provide the generated voltages to the word lines WL0 to WLm through the row decoder 130.

According to this embodiment, the voltage generator 190 is configured to generate a plurality of selection read voltages in the read retry operation. For example, the voltage generator 190 generates selection read voltages increased or decreased by a predetermined voltage variation ($\Delta V$). The selection read voltages increased or decreased by the predetermined voltage variation ($\Delta V$) are defined as variable (or varied/changed) selection read voltages Variable Vrd. The voltage generator 190 is configured to generate a plurality of non-selection read voltages in the read retry operation. For example, the voltage generator 190 generates non-selection read voltages decreased by the predetermined voltage variation ($\Delta V$). The non-selection read voltages decreased by the predetermined voltage variation ($\Delta V$) are defined as variable non-selection read voltages Variable Vpass.

The nonvolatile memory device 100 according to this embodiment performs a read retry operation on a memory cell detected as one in which a read error occurs in the read operation. In the read retry operation, the selection read voltage applied to the memory cell is changed whenever the read retry operation is performed, and applied to the memory cell. That is, in the read retry operation, the variable selection read voltage is applied to the selected memory cell. In the read retry operation, the non-selection read voltage that is applied to the non-selected memory cells is changed whenever the read retry operation is performed, and applied to the non-selected memory cells. That is, in the read retry operation, the variable non-selection read voltage is applied to the non-selected memory cells.

Figure 2:
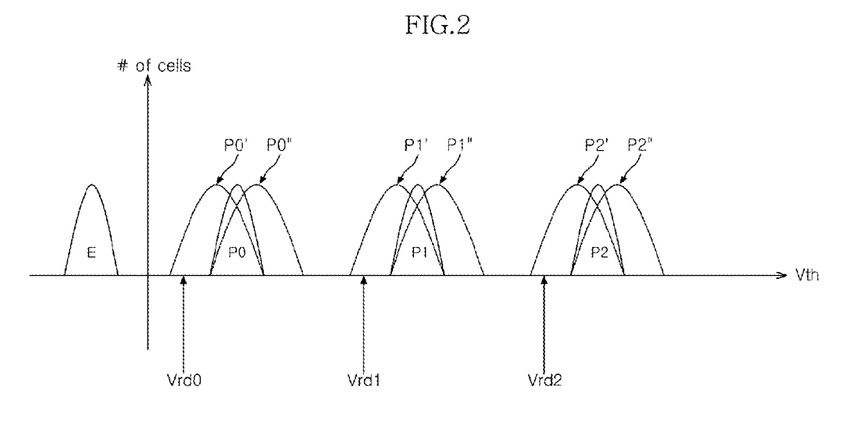
FIG. 2 is a diagram illustrating threshold voltage distributions which can be formed in each memory cell of the nonvolatile memory device illustrated in FIG. 1.

FIG. 2 is a diagram illustrating threshold voltage distributions which can be formed in each memory cell of the nonvolatile memory device illustrated in FIG. 1. Referring to FIG. 2, threshold voltage distributions of the MLC storing two or more-bit data are illustrated.

The memory cell is programmed in any one of an erase state E and a plurality of program states P0, P1 and P2. In the read operation, any one of selection read voltages Vrd0, Vrd1 and Vrd2 is applied to the selected word line. The first selection read voltage Vrd0 corresponds to a voltage between the erase state E and the first program state P0. The second selection read voltage Vrd1 corresponds to a voltage between the first program state P0 and the second program state P1. The third selection read voltage Vrd2 corresponds to a voltage between the second program state P1 and the third program state P2.

The threshold voltage distributions illustrated in FIG. 2 can be changed into an unintended state due to several factors. For example, as the program or erase operation of a memory cell is repeated, a defect of an insulating layer can occur. The defect of the insulating layer causes a problem of thermion radiation, electric charge diffusion, program disturbance, high-temperature stress, soft program or over-program, and therefore, the electric charge holding characteristic of the memory cell can be changed. As a result, as illustrated in FIG. 2, the threshold voltage distribution of the memory cell can be changed (See threshold voltage distributions indicated by dotted lines associated with program states, P0', P0'', P1', P1'', P2' and P2"). The change in the threshold voltage distribution of the memory cell can induce a decrease in read margin and a read error.

According to this embodiment, in order to improve the reliability of the nonvolatile memory device, the read operation is again performed by changing the level of the selection read voltage applied to the selected memory cell when a read error occurs (i.e., when the read operation fails). Alternatively, when a read error occurs, the read operation is again performed by changing the level of the non-selection read voltage applied to the non-selected memory cells.

Figure 3:
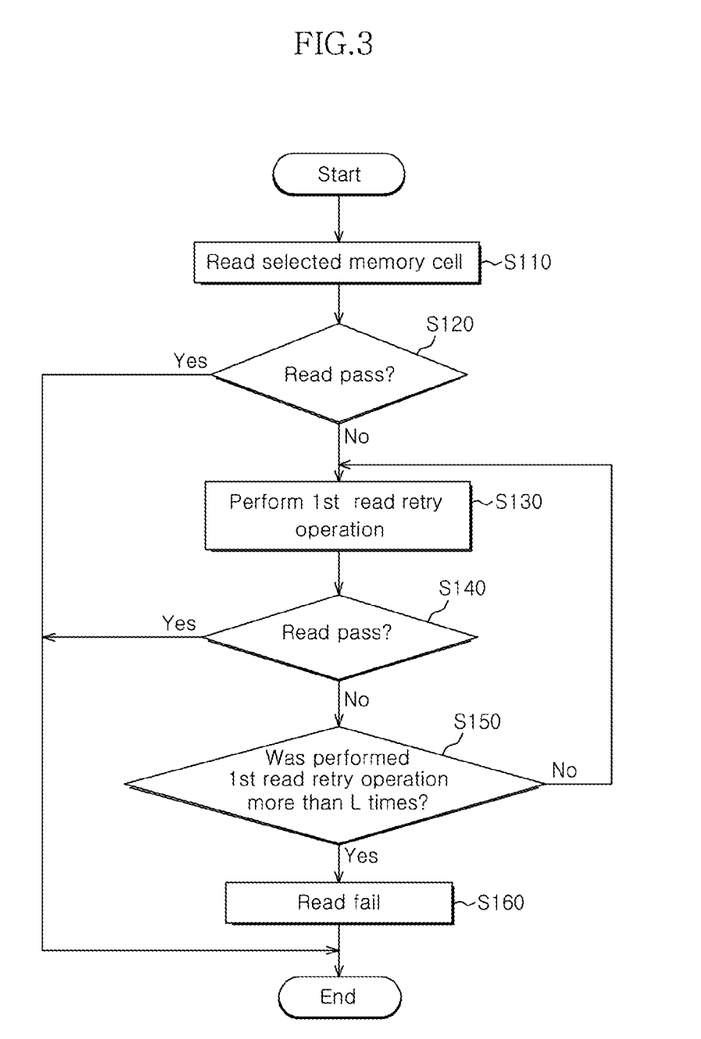
FIG. 3 is a flowchart illustrating a method of reading a nonvolatile memory device according to one embodiment.
Figure 4:
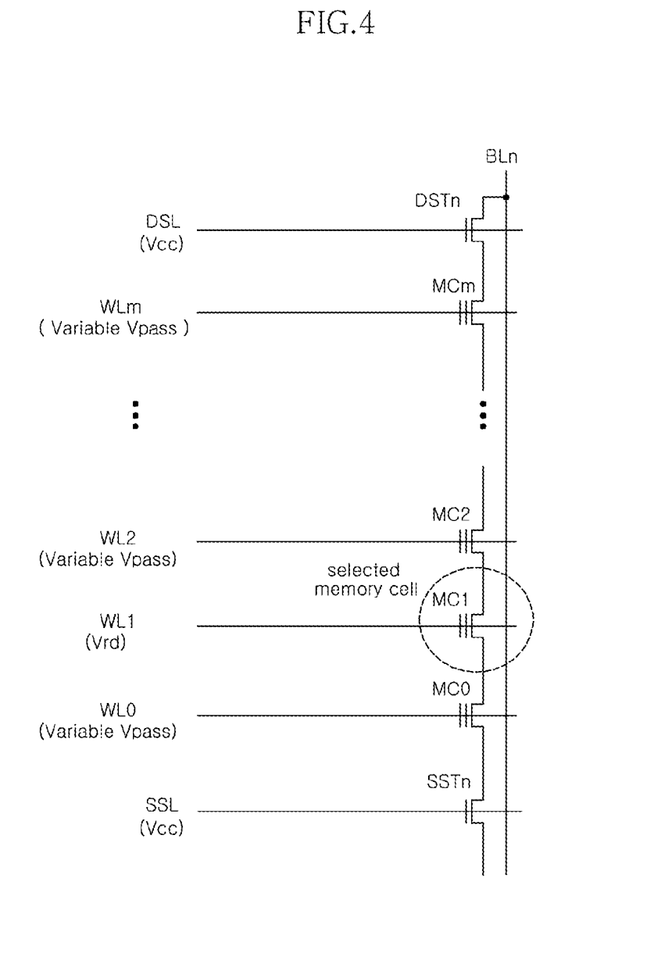
FIG. 4 is a circuit diagram illustrating a part of a memory cell array of the nonvolatile memory device, illustrating the method of reading the nonvolatile memory device according to an embodiment.
Figure 5:
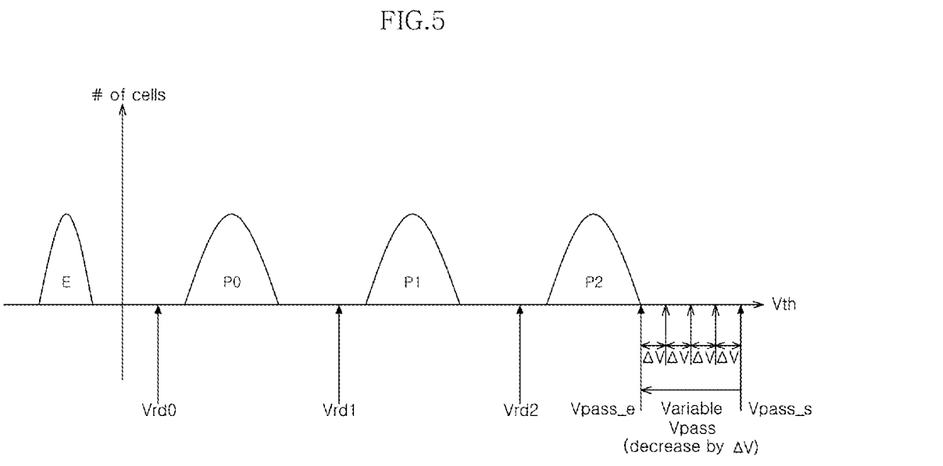
FIG. 5 is a diagram illustrating a non-selection read voltage in method of reading of the non-volatile memory device according to an embodiment.
Figure 6:
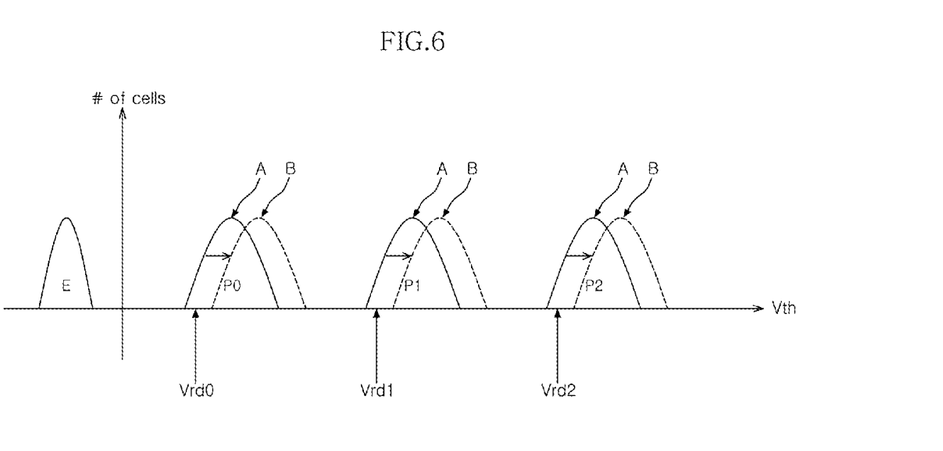
FIG. 6 is a diagram illustrating threshold voltage distributions of a selected memory cell, sensed based on a variable non-selection read voltage according to an embodiment.

FIG. 3 is a flowchart illustrating a reading method of a nonvolatile memory device according to one embodiment. FIG. 4 is a circuit diagram illustrating a part of a memory cell array of the nonvolatile memory device, illustrating the reading method of the nonvolatile memory device according to an embodiment. FIG. 5 is a diagram illustrating a non-selection read voltage in the reading method of the non-volatile memory device according to an embodiment. FIG. 6 is a diagram illustrating threshold voltage distributions of a selected memory cell, sensed based on a variable non-selection read voltage according to an embodiment. Hereinafter, a reading method of the nonvolatile memory device according to an embodiment will be described in detail with reference to FIGS. 3 to 6.

First, at step S110, a read operation of a selected memory cell MC1 is performed. For example, any one of selection read voltages Vrd0, Vrd1 and Vrd2 is applied to the selected memory cell MC1, and a non-selection read voltage Vpass_s is applied to non-selected memory cells MC0 and MC2 to MCm. The read operation of the selected memory cell MC1 is performed under such a bias condition.

At step S120, it is decided whether or not the read operation of the selected memory cell MC1 succeeds. When the read operation of the selected memory cell MC1 has succeeded (i.e., when the read operation passes), the read operation is finished. On the other hand, when the read operation of the selected memory cell MC1 has not succeeded (i.e., the read operation fails), the procedure proceeds to step S130.

As step S130, a read retry operation of the selected memory cell MC1 is performed. In the read retry operation, a non-selection read voltage having a level different from that of the non-selection read voltage Vpass_s applied in the read operation at the step S110 is applied to the non-selected memory cells MC0 and MC2 to MCm. For example, a non-selection read voltage decreased by a predetermined voltage variation (ΔV) from the non-selection read voltage Vpass_s applied in the read operation at the step S110, i.e., a variable non-selection read voltage Variable Vpass, is applied to the non-selected memory cells MC0 and MC2 to MCm.

Although it has been illustrated in FIG. 4 that the variable non-selection read voltage Variable Vpass is applied to all the non-selected memory cells MC0 and MC2 to MCm, the present invention is not limited thereto. As an example, the variable non-selection read voltage Variable Vpass can be applied to only the memory cells MC0 and MC2 adjacent to the selected memory cell MC1. As another example, the variable non-selection read voltage Variable Vpass can be applied to some of the non-selected memory cells MC0 and MC2 to MCm. That is, the non-selected memory cells MC0 and MC2 to MCm can be grouped into two or more groups, and the variable non-selection read voltage Variable Vpass can be applied to only one of the two or more groups.

Meanwhile, if the read retry operation is performed by applying the variable non-selection read voltage Variable Vpass to the non-selected memory cells MC0 and MC2 to MCm, the threshold voltage of the selected memory cell MC1 is increased from A to B, and the increased threshold voltage is sensed, as illustrated in FIG. 6.

That is, if the cell current of the selected memory cell MC1, which flows through the bit line BLn, is decreased by increasing the channel resistance of the non-selected memory cells MC0 and MC2 to MCm, the threshold voltage of the selected memory cell MC1 is increased, and the increased threshold voltage is sensed. This means that when the threshold voltage of the selected memory cell MC1 is lower than the selection read voltages Vrd0, Vrd1 and Vrd2 due to several reasons (i.e., when a read error occurs as the threshold voltage of the selected memory cell MC1 is changed into a threshold voltage distribution such as A), the read error of the selected memory cell MC1 can be resolved.

At step S140, the read retry operation is performed by applying the variable non-selection read voltage Variable Vpass to the non-selection memory cells MC0 and MC2 to MCm, and it is then determined whether the read operation of the selected memory cell MC1 succeeded. When the read operation of the selected memory cell MC1 has succeeded (i.e., when the read operation passes), the read operation is finished. On the other hand, when the read operation of the selected memory cell MC1 has not succeeded (i.e., the read operation fails), the procedure proceeds to step S150.

At the step S150, it is determined whether the read retry operation has been performed a predetermined number of times (maximum L times). When the read operation has been repeated the predetermined number of times and the read operation has not succeeded, the procedure proceeds to step S160. That is, the read operation has failed and the procedure is finished. On the other hand, when the read retry operation has not been repeated the predetermined number of times, the read retry operation is performed again by applying the variable non-selection read voltage Variable Vpass decreased by the predetermined voltage variation (ΔV). Meanwhile, when the read retry operation is repeatedly performed the maximum L times, the level of a variable non-selection read voltage Vpass_e can have a value greater than or identical to the maximum threshold voltage distribution P2 of the memory cells MC0 to MCm.

According to this embodiment, the read retry operation is performed on the selected memory cell MC1 detected as one in which the read error occurs in the read operation. In the read retry operation, the non-selection read voltage applied to the non-selected memory cells MC0 and MC2 to MCm is changed whenever the read retry operation is performed, and the changed non-selection read voltage is applied to the non-selected memory cells MC0 and MC2 to MCm. That is, when the read retry operation is performed, a variable non-selection voltage lower than the previous non-selection read voltage is applied to the non-selected memory cells MC0 and MC2 to MCm. The read error of the selected memory cell MC1 can be resolved by the read retry operation.

Figure 7:
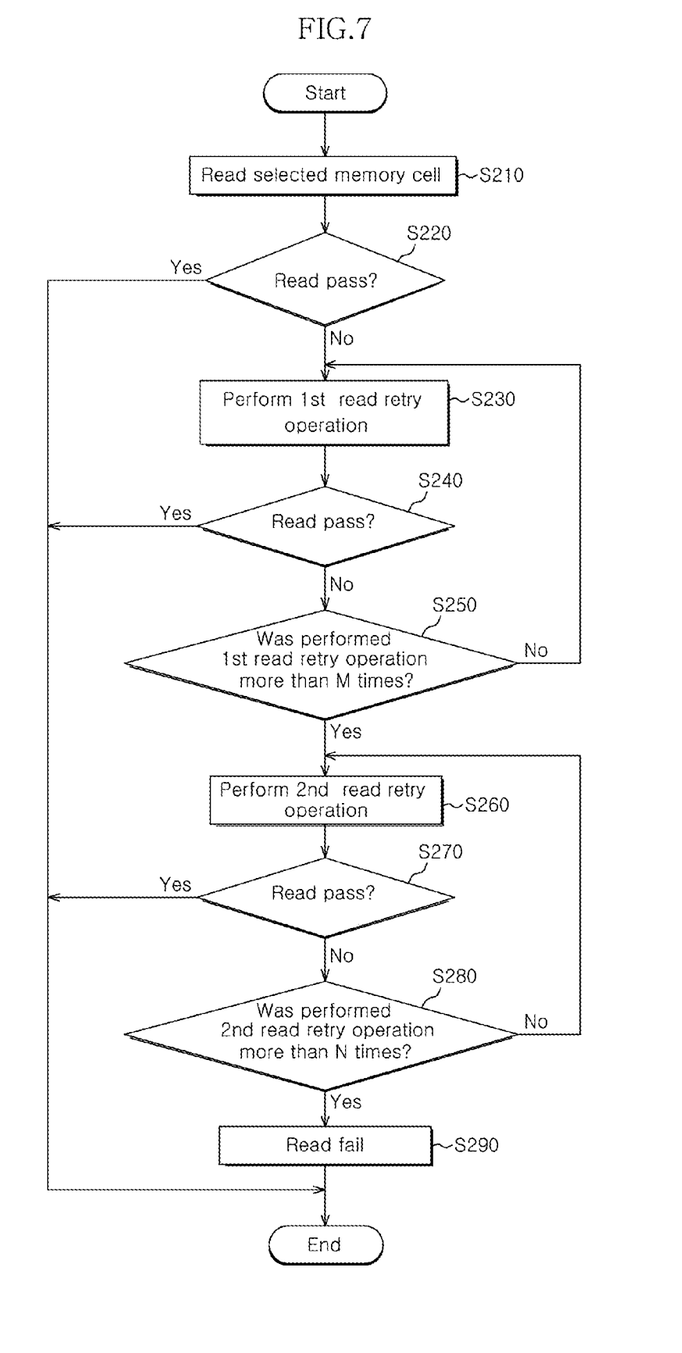
FIG. 7 is a flowchart illustrating a method of reading a nonvolatile memory device according to another embodiment.
Figure 8:
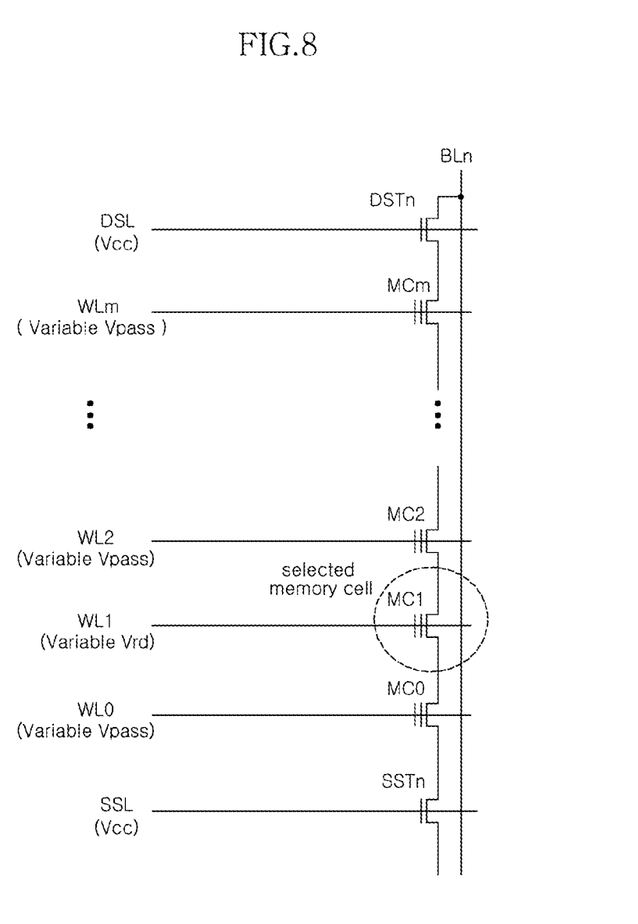
FIG. 8 is a circuit diagram illustrating a part of a memory cell array of the nonvolatile memory device, illustrating the method of reading the nonvolatile memory device according to the embodiment.
Figure 9:
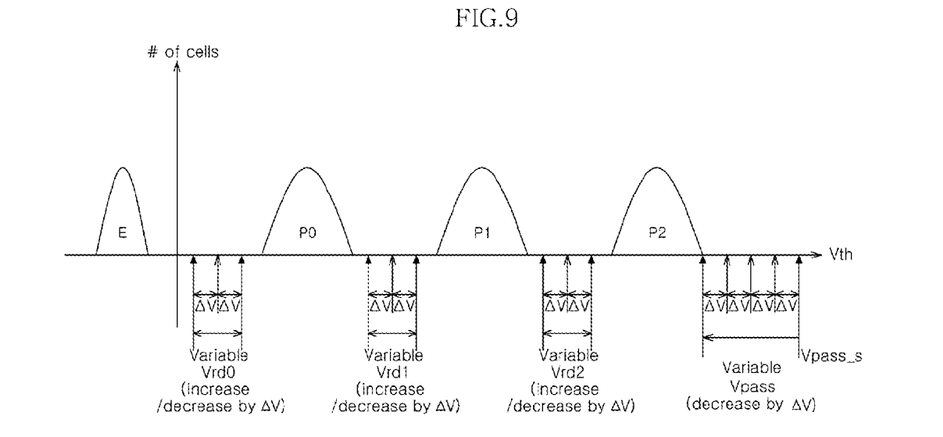
FIG. 9 is a diagram illustrating a selection read voltage and a non-selection read voltage in the method of reading the nonvolatile memory device according to an embodiment.

FIG. 7 is a flowchart illustrating a reading method of a nonvolatile memory device according to another embodiment. FIG. 8 is a circuit diagram illustrating a part of a memory cell array of the nonvolatile memory device, illustrating the reading method of the nonvolatile memory device according to the embodiment. FIG. 9 is a diagram illustrating a selection read voltage and a non-selection read voltage in the reading method of the nonvolatile memory device according to this embodiment. Hereinafter, the reading method of the nonvolatile memory device according to this embodiment will be described in detail with reference to FIGS. 7 to 9.

First, at step S210, a read operation of a selected memory cell MC1 is performed. For example, any one of selection read voltages Vrd0, Vrd1 and Vrd2 is applied to the selected memory cell MC1, and a non-selection read voltage Vpass_s is applied to non-selected memory cells MC0 and MC2 to MCm. The read operation of the selected memory cell MC1 is performed under such a bias condition.

At step S220, it is decided whether the read operation of the selected memory cell MC1 succeeds. When the read operation of the selected memory cell MC1 has succeeded (i.e., when the read operation passes), the read operation is finished. On the other hand, when the read operation of the selected memory cell MC1 has not succeeded (i.e., the read operation fails), the procedure proceeds to step S230.

At the step S230, a first read retry operation of the selected memory cell MC1 is performed. In the first read retry operation, a selection read voltage having a level different from the selection read voltage Vrd0, Vrd1 or Vrd2 is applied to the selected memory cell MC1. For example, a selection read voltage increased or decreased by a predetermined voltage variation (ΔV) from the selection read voltage Vrd0, Vrd1 or Vrd2 applied in the read operation at the step S210, i.e., a variable selection read voltage Variable Vrd, is applied to the selected memory cell MC1.

At step S240, the first read retry operation is performed by applying the variable selection read voltage Variable Vrd to the selected memory cell MC1, and it is determined whether the read operation of the selected memory cell MC1 succeeded. When the read operation of the selected memory cell MC1 has succeeded (i.e., when the read operation passes), the read operation is finished. On the other hand, when the read operation of the selected memory cell MC1 has not succeeded (i.e., the read operation fails), the procedure proceeds to step S250.

At the step S250, it is determined whether the first read retry operation has been repeatedly performed a predetermined number of times (maximum M times). When the read operation has been repeated the predetermined number of times and the read operation has not succeeded, the procedure proceeds to step S260. On the other hand, when the first read retry operation has not been repeated the predetermined number of times, the first read retry operation is again performed by applying the variable non-selection read voltage Variable Vrd that is increased or decreased by the predetermined voltage variation (ΔV).

When the first read retry operation is performed the maximum M times and the read operation of the selected memory cell MC1 has not succeeded, a second read retry operation is performed at step S260. In the second read retry operation, a non-selection read voltage having a level different from the non-selection read voltage Vpass_s is applied to the non-selected memory cells MC0 and MC2 to MCm. For example, a non-selection read voltage decreased by the predetermined voltage variation (ΔV) from the non-selection read voltage Vpass_s applied in the read operation at the step S210, i.e., a variable non-selection read voltage Variable Vpass, is applied to the non-selected memory cells MC0 and MC2 to MCm.

Although it has been illustrated in FIG. 8 that the variable non-selection read voltage Variable Vpass is applied to all the non-selection memory cells MC0 and MC2 to MCm, the present invention is not limited thereto. As an example, the variable non-selection read voltage Variable Vpass can be applied to only the non-selected memory cells MC0 and MC2 adjacent to the selected memory cell MC1. As another example, the variable non-selection read voltage Variable Vpass can be applied to some of the non-selection memory cells MC0 and MC2 to MCm. That is, the non-selective memory cells MC0 and MC2 to MCm can be grouped into two or more groups, and the variable non-selection read voltage Variable Vpass can be applied to any one of the two or more groups.

Meanwhile, if the second read retry operation is performed by applying the variable non-selection read voltage Variable Vpass to the non-selection memory cells MC0 and MC2 to MCm, the threshold voltage of the selected memory cell MC1 is increased from A to B, and the increased threshold voltage is sensed, as illustrated in FIG. 6. That is, if the cell current of the selected memory cell MC1, which flows through the bit line BLn, is decreased by increasing the channel resistance of the non-selected memory cells MC0 and MC2 to MCm, the threshold voltage of the selected memory cell MC1 is increased, and the increased threshold voltage is sensed. This means that when the threshold voltage of the selected memory cell MC1 is lower than the selection read voltages Vrd0, Vrd1 and Vrd2 due to several reasons (i.e., when a read error occurs as the threshold voltage of the selected memory cell MC1 is changed into a threshold voltage distribution such as A), the read error of the selected memory cell MC1 can be resolved.

At step S270, the second read retry operation is performed by applying the variable non-selection read voltage Variable Vpass to the non-selection memory cells MC0 and MC2 to MCm, and it is then determined whether the read operation of the selected memory cell MC1 succeeded. If the read operation of the selected memory cell MC1 succeeded (i.e., when the read operation passes), the read operation is finished. On the other hand, when the read operation of the selected memory cell MC1 has not succeeded (i.e., the read operation fails), the procedure proceeds to step S280.

At step S280, it is decided whether or not the read retry operation has been performed a predetermined number of times (maximum N times). When the read retry operation has been repeated the predetermined number of times and the read operation has not succeeded, the procedure proceeds to step S290. That is, the read operation failed, and the procedure is finished. On the other hand, when the read retry operation has not been repeated the predetermined number of times, the second read retry operation is performed again by applying the variable non-selection read voltage Variable Vpass decreased by the predetermined voltage variation (ΔV).

According to this embodiment, one or more read retry operations are performed on the selected memory cell MC1 detected as one in which a read error occurred. That is, the first and second read retry operations are performed. In the first read retry operation, the selection read voltage applied to the selected memory cell MC1 is changed whenever the first read retry operation is performed, and the changed selection read voltage is applied to the selected memory cell MC1. That is, whenever the first read retry operation is performed, the variable selection read voltage Variable Vrd increased or decreased more than the previous selection read voltage is applied to the selected memory cell MC1. In the second read retry operation, the non-selection read voltage applied to the non-selected memory cells MC0 and MC2 to MCm is changed whenever the second read retry operation is performed, and the changed non-selection read voltage is applied to the non-selected memory cells MC0 and MC2 to MCm. That is, whenever the second read retry operation is performed, the variable non-selection read voltage Variable Vpass, lower than the previous non-selection read voltage, is applied to the non-selected memory cells MC0 and MC2 to MCm. The read error of the selected memory cell MC1 can be resolved by the first and second read retry operations. Also, in some embodiments, a selection read voltage applied to a selected memory cell in a read operation may be identical or substantially equal to a selection read voltage applied to the selected memory cell in the read retry operation. Further, a non-selection read voltage applied to a non-selected memory cell in a read operation may be identical or substantially equal to a non-selection read voltage applied to the non-selected memory cells in the first read retry operation. Still further, a selection read voltage applied to a selected memory cell in a read operation may be identical or substantially equal to a selection read voltage applied to the selected memory cell in a second read retry operation.

Figure 10:
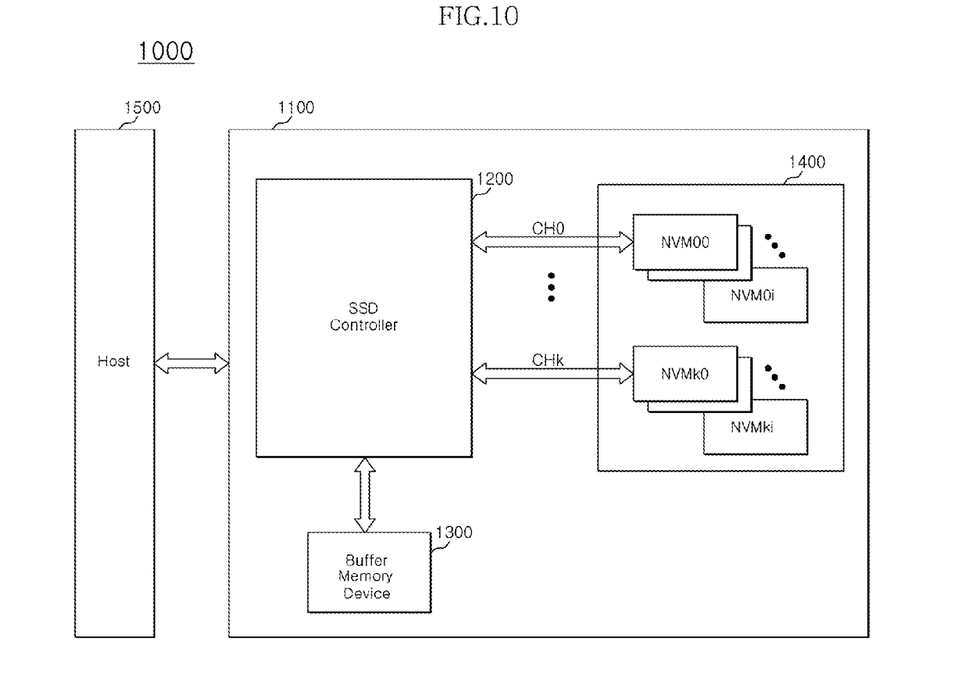
FIG. 10 is a block diagram illustrating a data processing system including the nonvolatile memory device according to the embodiments.

FIG. 10 is a block diagram illustrating a data processing system including the nonvolatile memory device according to the embodiments. Referring to FIG. 10, the data processing system 1000 can be configured to include a data storage device 1100 and a host device 1500. The data storage device 1100 can be configured as a solid state drive (hereinafter, referred to as an 'SSD').

The SSD 1100 includes an SSD controller 1200, a buffer memory device 1300 and a data storage medium 1400. The SSD 1100 can further include an arbitrary power circuit having super capacitors. The arbitrary power circuit can supply power so that the SSD 1100 is normally finished when a sudden power off occurs.

The SSD 1100 operates in response to an access request of the host 1500. That is, the SSD controller 1200 is configured to access the data storage medium 1400 in response to the request from the host device 1500. For example, the SSD controller 1200 is configured to control read, program and erase operations of the data storage medium 1400.

The buffer memory device 1300 is configured to arbitrarily store data to be stored in the data storage medium 1400. The buffer memory device 1300 is configured to arbitrarily store data read from the data storage medium 1400. The data stored in the buffer memory device 1300 is transmitted to the data storage medium 1400 or the host device 1500 under control of the SSD controller 1200.

The SSD controller 1200 is connected to the data storage medium through a plurality of channels CH0 to CHk. A plurality of nonvolatile memory devices NVM00 to NVM0i and NVMk0 to NVMki are connected to the respective channels CH0 to CHk. The data storage medium 1400 can be configured as the non-volatile memory device 100 of FIG. 1. Thus, it is possible to improve the data reliability of the SSD 1100.

Figure 11:
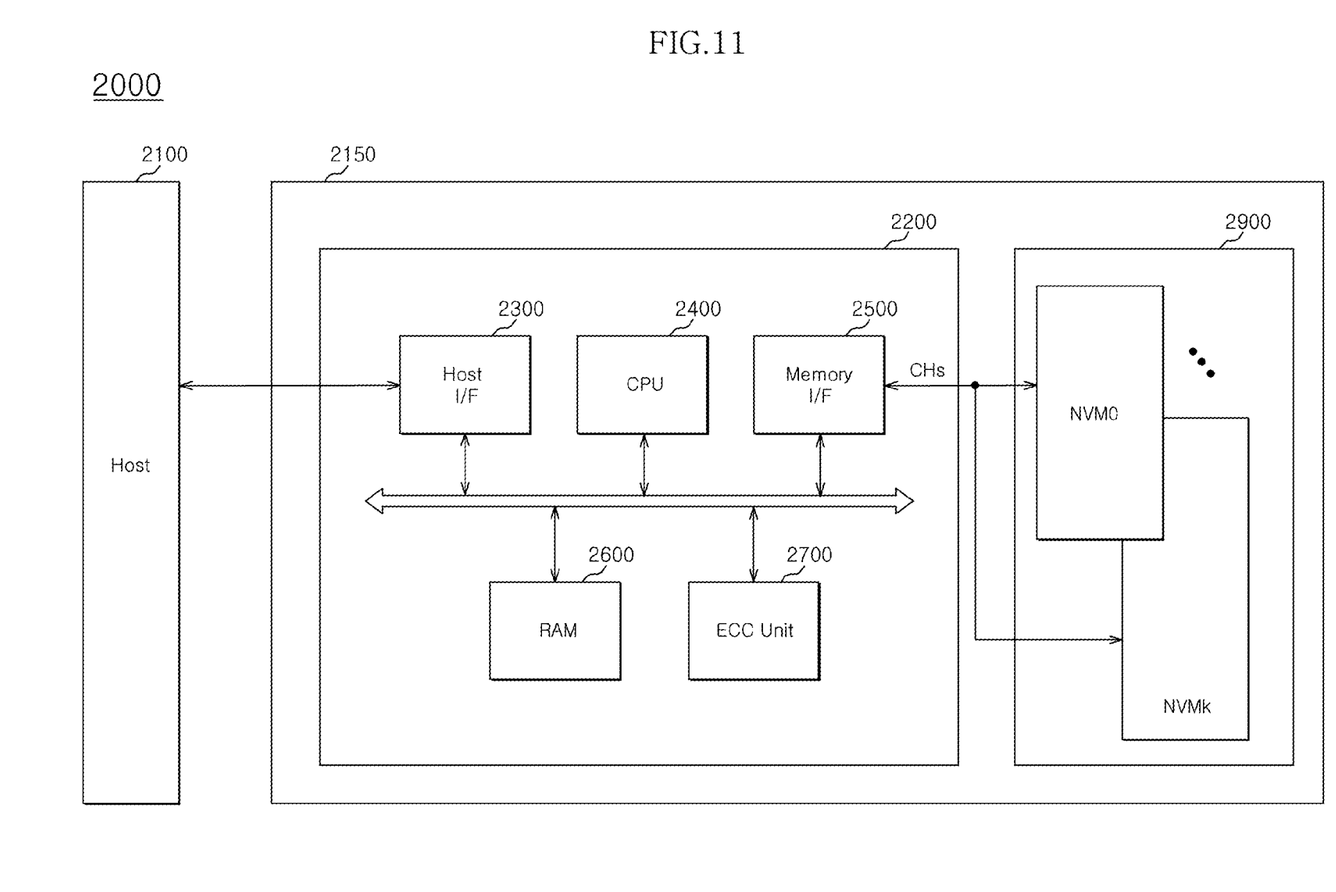
FIG. 11 is another block diagram illustrating a data processing system including the nonvolatile memory device according to the embodiments.

FIG. 11 is another block diagram illustrating a data processing system including the nonvolatile memory device according to the embodiments. Referring to FIG. 11, the data processing system 2000 includes a host device 2100 and a data storage device 2150. The data storage device 2150 includes a controller 2200 and a data storage medium 2900.

The controller 2200 is connected to the host device 2100 and the data storage medium 2900. The controller 2200 is configured to access the data storage medium 2900 in response to a request from the host device 2100. For example, the controller 2200 is configured to control read, program and erase operations of the data storage medium 2900. The controller 2200 is configured to drive firmware for controlling the data storage medium 2900.

The controller 2200 can include well-known components such as a host interface 2300, a central processing unit (CPU) 2400, a memory interface 2500, a RAM 2600 and an error correction code unit 2700.

The CPU 2400 controls all sorts of operations of the controller 2200. The RAM 2600 can be used as a working memory of the CPU 2400.

The host interface 2300 is configured to interface the host 2100 and the controller 2200. For example, the host interface 2300 can be configured to communicate with the host 2300 through one of various interface protocols such as a universal serial bus (USB) protocol, a multimedia card (MMC) protocol, a peripheral component interconnection (PCI) protocol, PCI-express (PCI-E) protocol, a parallel advanced technology attachment (PATA) protocol, a serial ATA (SATA) protocol, a small computer small interface (SCSI) protocol and an integrated drive electronics (IDE) protocol.

The memory interface 2500 is configured to interface the controller 2200 and the data storage medium 2900. The data storage medium 2900 can be configured as the non-volatile memory device 100 of FIG. 1. Thus, it is impossible to improve the data reliability of the data storage 2150.

The error correction code unit 2700 is configured to detect an error of data read from the data storage medium 2900 and to correct the detected error.

The controller 2200 and the data storage medium 2900 can be integrated as one semiconductor device so as to constitute a memory card. As an example, the controller 2200 and the data storage medium 2900 can be integrated as one semiconductor device so as to constitute a personal computer memory card international association (PCMCIA) card, a compact flash (CF) card, a smart media card, a memory stick, a multimedia card (MMC, RS-MMC or MMC-micro), a secure digital (SD) card (SD, Mini-SD or Micro-SD), a universal flash storage (UFS), etc.

As another example, the controller 2200 or the data storage medium 2900 can be mounted as various types of packages. For example, the controller 2200 or the data storage medium 2900 can be mounted using packaging methods such as package on package (POP), a ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi chip package (MCP), wafer-level fabricated package (WFP) and wafer-level processed stack package (WSP).

Figure 12:
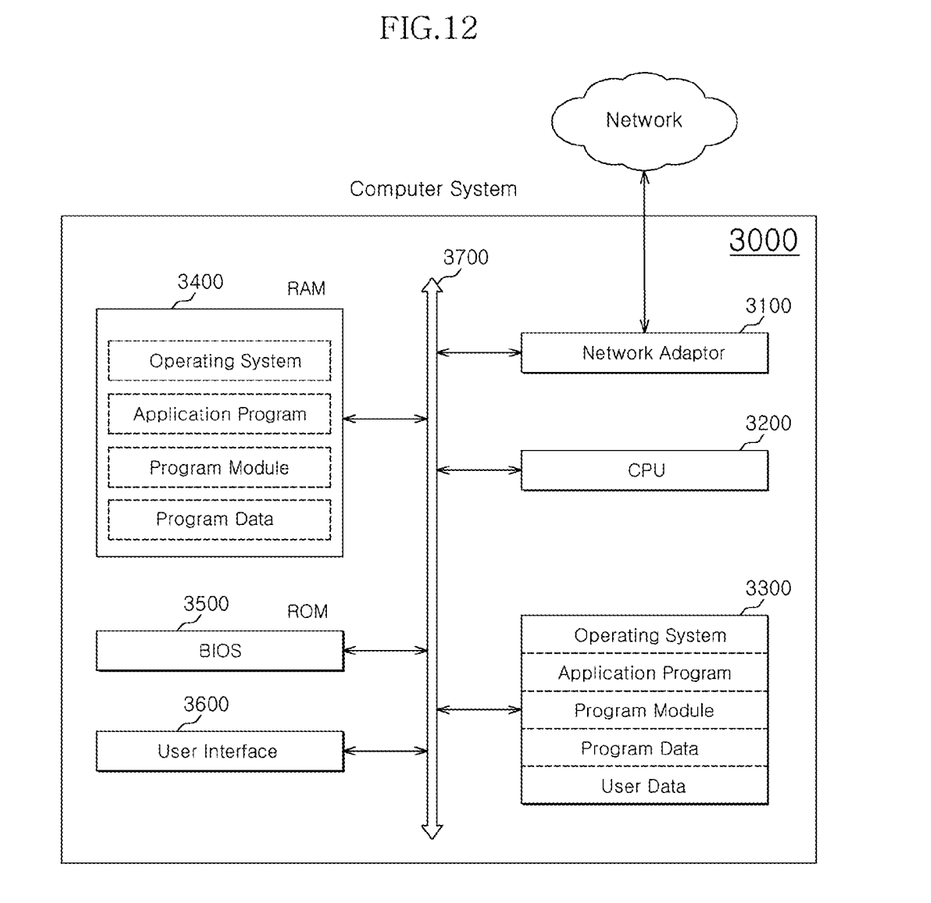
FIG. 12 is a block diagram illustrating a computer system having the data processing system of FIG. 10 or 11.

FIG. 12 is a block diagram illustrating a computer system having the data processing system of FIG. 10 or 11. Referring to FIG. 12, the computer system 3000 includes a network adaptor 3100, a central processing unit (CPU) 3200, a data storage device 3300, a RAM 3400, a ROM 3500 and a user interface 3600, which are electrically connected to a system bus 3700. Here, the data storage device 3300 can be configured as the data storage device 1100 illustrated in FIG. 10. Alternatively, the data storage device 3300 can be configured as the data storage device 2150.

The network adaptor 3100 provides interfacing between the computer system 3000 and external networks. The CPU 3200 performs all sorts of operating processes for an operating system or application program residing in the RAM 3400.

The data storage device 3300 stores all sorts of data required in the computer system 3000. For example, the data storage device 3300 stores an operating system for operating the computer system, application program, various program modules, program data, user data, and the like.

The RAM 3400 can be used as an operating memory device of the computer system 3000. When the computer system 3000 is booted, the operating system, the application program and the variable program modules, read from the data storage 330, and the program data used to drive the programs are loaded in the RAM 3400. The ROM 3500 stores a basic input/output system (BIOS) activated from before the operating system is driven. Information exchange is performed between the computer system 3000 and a user through the user interface 3600.

In addition, the computer system 3000 can further include a battery, a modem, etc. Although not shown in this figure, it will be readily understood that an application chipset, a camera image processor (CIS) and the like can be further included in the computer system 3000.

According to the embodiments of the present invention, a read error can be effectively prevented, thereby improving the reliability of the non-volatile memory device.

While certain embodiments have been described above, it will be understood to those skilled in the art that the embodiments described are by way of example only. Accordingly, the device and method described herein should not be limited based on the described embodiments. Rather, the device and method described herein should be understood in light of the claims that follow when taken in conjunction with the above description and accompanying drawings.

What is claimed is:

1. A method of reading a nonvolatile memory device, the method comprising:
   a read operation of reading data of a selected memory cell;
   a first read retry operation of performing one or more read operations by changing a selection read voltage applied to the selected memory cell until the read operation succeeds, when it is detected that an error has occurred in the read operation; and
   a second read retry operation of performing one or more read operations by changing a non-selection read voltage applied to non-selected memory cells until the read operation succeeds, when it is detected that an error has occurred in the first read retry operation.

2. The method according to claim 1, wherein the selection read voltage applied in the first read retry operation is higher than the selection read voltage applied in the read operation.

3. The method according to claim 2, wherein the selection read voltage is increased whenever the first read retry operation is repeated.

4. The method according to claim 1, wherein the selection read voltage applied in the first read retry operation is lower than the selection read voltage applied in the read operation.

5. The method according to claim 4, wherein the selection read voltage is decreased whenever the first read retry operation is repeated.

6. The method according to claim 1, wherein the non-selection read voltage applied to the non-selected memory cells in the read operation is identical to the non-selection read voltage applied to the non-selected memory cells in the first read retry operation.

7. The method according to claim 1, wherein the non-selection read voltage applied to the non-selected memory cells in the second read retry operation is lower than the non-selection read voltage applied to the non-selected memory cells in the read operation.

8. The method according to claim 7, wherein the non-selection read voltage is decreased whenever the second read retry operation is repeated.

9. The method according to claim 8, wherein the non-selection read voltage applied to the non-selected memory cells in the second read retry operation is higher than the threshold voltage of the selected memory cell in a maximum program state.

10. The method according to claim 1, wherein the selection read voltage applied to the selected memory cell in the read operation is identical to the selection read voltage applied to the selected memory cell in the second read retry operation.

11. A nonvolatile memory device, comprising:
    a memory cell array configured to comprise a plurality of memory cells arranged in intersection portions of word lines and bit lines; and
    a control logic configured to control a read operation of a selected memory cell among the plurality of memory cells, a first read retry operation of performing one or more read operations by changing a selection read voltage applied to the selected memory cell until the read operation succeeds, when it is detected that an error has occurred in the read operation, and a second read retry operation of performing one or more read operations by changing a non-selection read voltage applied to non-selected memory cells until the read operation succeeds, when it is detected that an error has occurred in the first read retry operation.

12. The nonvolatile memory device according to claim 11, wherein the selection read voltage applied in the first read retry operation is higher than the selection read voltage applied in the read operation.

13. The nonvolatile memory device according to claim 11, wherein the selection read voltage applied in the first read retry operation is lower than the selection read voltage applied in the read operation.

14. The nonvolatile memory device according to claim 11, wherein the non-selection read voltage applied to the non-selected memory cells in the read operation is identical to the non-selection read voltage applied to the non-selected memory cells in the first read retry operation.

15. The nonvolatile memory device according to claim 11, wherein the non-selection read voltage applied to the non-selected memory cells in the second read retry operation is lower than the non-selection read voltage applied to the non-selected memory cells in the read operation.

16. The nonvolatile memory device according to claim 15, wherein the non-selection read voltage applied to the non-selected memory cells in the second read retry operation is higher than the threshold voltage of the selected memory cell in a maximum program state.

17. The nonvolatile memory device according to claim 11, wherein the selection read voltage applied to the selected memory cell in the read operation is identical to the selection read voltage applied to the selected memory cell in the second read retry operation.

* * * * *